United States Patent
Oh et al.

(10) Patent No.: US 6,683,034 B1
(45) Date of Patent: Jan. 27, 2004

(54) STRIPPER COMPOSITION FOR NEGATIVE CHEMICALLY AMPLIFIED RESIST

(75) Inventors: Chang-Il Oh, Seongnam (KR); Sang-Dai Lee, Kyungki-do (KR); Chong-Soon Yoo, Kyungki-do (KR)

(73) Assignee: Dongjin Semichem Co., Ltd., Incheon (KR)

( * ) Notice: Subject to any disclaimer, the term of this patent is extended or adjusted under 35 U.S.C. 154(b) by 187 days.

(21) Appl. No.: 10/019,607

(22) PCT Filed: Jun. 27, 2000

(86) PCT No.: PCT/KR00/00671

§ 371 (c)(1),
(2), (4) Date: Dec. 28, 2001

(87) PCT Pub. No.: WO01/00759

PCT Pub. Date: Jan. 4, 2001

(30) Foreign Application Priority Data

Jun. 28, 1999 (KR) .......................................... 1999/24841

(51) Int. Cl.⁷ .............................. C11D 1/22; C11D 3/43
(52) U.S. Cl. ........................... 510/176; 510/175; 134/3; 438/745
(58) Field of Search ................................. 510/175, 176, 510/177, 178; 134/3, 4, 38, 40; 438/745

(56) References Cited

U.S. PATENT DOCUMENTS

| | | | |
|---|---|---|---|
| 4,165,294 A | | 8/1979 | Vander Mey |
| 4,507,155 A | * | 3/1985 | Cheek .......................... 134/6 |
| 4,844,832 A | | 7/1989 | Kobayashi et al. |
| 4,971,715 A | | 11/1990 | Armant et al. |
| 5,437,808 A | * | 8/1995 | Weltman et al. ............ 510/407 |
| 5,728,664 A | | 3/1998 | Michelotti |
| 5,863,346 A | | 1/1999 | Michelotti |
| 6,475,292 B1 | * | 11/2002 | Sahbari ......................... 134/3 |

FOREIGN PATENT DOCUMENTS

| | | |
|---|---|---|
| EP | 0119337 | 9/1984 |
| EP | 0369224 | 5/1990 |
| JP | 5172503 | 6/1976 |
| JP | 62035357 | 2/1987 |
| JP | 4307695 | 10/1992 |
| KR | WO01/00759 | * 1/2001 |
| WO | 9739092 | 10/1997 |

OTHER PUBLICATIONS

Patent Abstracts of Japan, Publication No. 62–035367, Application No. 60–174042, (Mitsui Petrochem Ind. Ltd.), application filed Aug. 9, 1985, application published Feb. 16, 1987.

English translation of Claim 1 of Japanese Patent Laid–open Publication No. Showa 43–7695. 1987.

English translation of Claim 1 of Japanese Patent Laid–open Publication No. Showa 51–72503. 1995.

* cited by examiner

Primary Examiner—Gregory Webb
(74) Attorney, Agent, or Firm—Baker Botts LLP

(57) ABSTRACT

The present invention relates to a nonaqueous stripper composition for negative chemically amplified resists which shows excellent removing capabilities, has anticorrosive effects on varieties of metallic substrate plates such as Al, W, TiN, WSi, SiON, SiNx, HTO, etc., improves productivity since it can be recycled as a nonaqueous stripper even after many applications, and is suitable in electronic material fields in which high precision processing is required in the negative chemically amplified resist removing process. The present invention provides a stripper composition for negative chemically amplified resists comprising a) 20 to 35 weight % of straight chained alkylbenzenesulfonic acid; b) 10 to 34 weight % of light aromatic naphtha solvent; c) 30 to 45 weight % of organic compounds containing chlorine; d) 15 to 25 weight % of hydroxybenzenes; and e) 0.5 to 5 weight % of polyoxyethylene octylphenylether derivatives, in order to accomplish the above objects.

5 Claims, No Drawings

STRIPPER COMPOSITION FOR NEGATIVE CHEMICALLY AMPLIFIED RESIST

CROSS REFERENCE TO RELATED APPLICATION

This application is based on application No. 10-1999-0024841 filed in the Korean Industrial Property. Office on Jun. 28, 1999, the content of which is incorporated hereinto by reference.

BACKGROUND OF THE INVENTION (a) Field of the Invention

The present invention relates to a nonaqueous stripper composition for negative chemically amplified resists which shows excellent removing capabilities, has anticorrosive effects on varieties of metallic substrate plates such as Al, W, TiN, WSi, SiON, SiNx, HTO, etc., improves productivity since it can be recycled as a nonaqueous stripper even after many applications, and is suitable in electronic material fields in which high precision processing is required, such as in the negative chemically amplified resist removing process which is recently noticed as resist pattern miniaturization is increasing in the manufacturing process of semiconductor components such as Integrated Circuit, Large Scale Integration, Very Large Scale Integration, etc.

(b) Description of the Related Art

Semiconductor components such as Integrated Circuit, Large Scale Integration, Very Large Scale Integration, etc. have been manufactured with lithography technology using a photoetching method. According to this photoetching method, semiconductor components are obtained by the process comprising forming a photoresist layer on an inorganic material substrate such as silicone wafer, etc. by a spin-coating method, exposing to light through a mask having desirable patterns thereon, forming a resist pattern by proceeding with the development treatment, carrying out an etching treatment or a diffusion treatment on the photoresist layer thereby exposing parts of the inorganic material substrate with this resist pattern being used as a mask, and delaminating and removing the used resist pattern from the inorganic material substrate using a stripper.

Varieties of organic or inorganic based strippers have been developed and used in the resist delamination. An organic based stripper comprising a main constituent of organic sulfonic acid is disclosed in Japanese Patent Laid-open Publication No. Showa 51-72503, and an organic stripper comprising a main constituent of alkylene glycol is disclosed in Japanese Patent Laid-open Publication No. Showa 43-7695. Furthermore, there are the piranha rinsing method using a mixture of nitric acid and hydrogen peroxide, and the RCA rinsing method combining ammonia and hydrogen peroxide, hydrochloric acid and hydrogen peroxide, and hydrofluoric acid, etc. as an inorganic based stripper.

However, technologies to stably perform 0.5 or less $\mu$m microprocessing have recently been required as the resist pattern micronization is proceeding with the recent high integration of semiconductor component circuits. Therefore, 0.5 or less $\mu$m pattern forming technologies have been required even in the currently produced photoresists, thus lithography technologies using radioactive rays having shorter wavelengths are being reviewed. As these radioactive rays discussed are ultraviolet rays represented as an I line having a wavelength of 365 nm, far ultraviolet rays represented as a KrF excimer having a wavelength of 248 nm and an ArF excimer having a wavelength of 193 nm, X rays represented as synchrotron radioactive rays, electron beam charge corpuscular beams represented as electron beams, etc., and varieties of resists are being suggested to cope with these radioactive rays.

Among these noticed is a resist using a reaction causing solubility changes in a developer by catalysis of acids which are produced by radioactive ray irradiation. These are normally called "chemically amplified resists" which are divided into a negative type resist and a positive type resist. Particularly, it has been found that a negative type, resist has superior sensitivity, heat resistance, and adhesion to a substrate, and comprises an alkaline soluble binder resin, a cross link agent, an acid generating agent, and a solvent as main constituents. Binder resins become insoluble since acids are generated at areas irradiated by light exposing, and these acids activate a cross-linking agent in these resists. Thereafter, a negative type resist pattern can be materialized by carrying out the development. This materialized pattern is removed through the stripping process as the final step of the lithography process.

However, a negative type resist is difficult to delaminate and remove in the stripping process compared to a positive type resist. So, strong delaminating capabilities have been required in stripping a negative type resist, thus inorganic based strippers have been mainly used. In addition, the inconvenience exists that careful attention should be required in handling these inorganic strippers due to a bad influence on safety of workers as well as increases in the danger of fire when sulfuric acid, nitric acid, oleum, a mixture of nitric acid and hydrogen peroxide, etc. are heated to a high temperature of 120° C. or more before used. Furthermore, they have been economically ineffective since water based inorganic strippers should all be disposed of after use due to the incapability of recycling, unlike a non-aqueous composition of the present invention. Due to these problems, non-aqueous organic strippers are recently becoming more widely used, and varieties of strippers are being suggested.

For example, a mixed solution of alkylbenzenesulfonic acid and a non-halogenized aromatic hydrocarbon based solvent is disclosed in Japanese Patent Laid-open Publication No. Showa 51-72503, a mixed solution of alkylarylsulfonic acid, aqueous aromatic group sulfonic acid, and a non-halogenized aromatic hydrocarbon based solvent is disclosed in U.S. Pat. No. 4,165,294, and a stripper in which polar or non polar organic solvent is added to organic sulfonic acid and 1,2-dihydroxybenzene is disclosed in European Patent Laid-open Publication No. 0119337. However, these strippers have low anticorrosive effects on varieties of metallic substrate plates such as Al, W, TiN, WSi, SiON, SiNx, HTO, etc., thus they are not practical in the applications.

SUMMARY OF THE INVENTION

It is an object of the present invention to provide a non-aqueous organic stripper composition for negative chemically amplified resists which has superior resist removal and delamination capabilities, anticorrosive effects on varieties of metallic substrate plates such as Al, W, TiN, WSi, SiON, SiNx, HTO, etc., recyclability as a non-aqueous stripper even after many uses, and can stably carry out 0.5 $\mu$m or less microprocessing taking into account problems of the conventional technologies.

In order to accomplish the objects, the present invention provides a stripper composition for negative chemically amplified resists comprising:

a) 20 to 35 weight % of straight chained alkylbenzenesulfonic acids represented as in the following Chemical Formula 1:

[Chemical Formula 1]

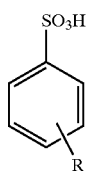

where R is an alkyl group having 10 to 14 carbons;

b) 10 to 34 weight % of light aromatic naphtha solvent;

c) 30 to 45 weight % of an organic compounds containing chlorine;

d) 15 to 25 weight % of hydroxybenzenes; and e) 0.5 to 5 weight % of polyoxyethylene octylphenylether derivatives.

An alkylbenzenesulfonic acid represented as in the Chemical Formula 1 of a) is preferably decylbenzenesulfonic acid or dodecylbenzenesulfonic acid.

Furthermore, the organic compounds containing chlorine of c) are preferably one or more compounds selected from the group consisting of 1,2,3-trichlorobenzene, 1,2,4-trichlorobenzene, and 1,3,5-trichlorobenzene.

Furthermore, the hydroxybenzenes of d) are preferably one or more benzenes selected from the group consisting of hydroxybenzene, o-cresol, m-cresol, p-cresol, and xylenol.

Furthermore, the polyoxyethylene octylphenylether derivatives of e) are preferably one or more derivatives selected from condensates having 7 to 12 moles of ethylene oxide.

DETAILED DESCRIPTION OF THE PREFERRED EMBODIMENTS

In the following detailed description, only the preferred embodiments of the invention have been shown and described, simply by way of illustration of the best mode contemplated by the inventor(s) of carrying out the invention. As will be realized, the invention is capable of modification in various obvious respects, all without departing from the invention. Accordingly, the description is to be regarded as illustrative in nature, and not restrictive.

The present invention is described in detail as follows.

The present invention could be completed by a composition consisting of straight shaped alkylbenzenesulfonic acid of which an alkyl group has from 10 to 14 carbons, light aromatic naphtha solvent, an organic compound containing chlorine, hydroxy benzenes, and a polyoxyethylene octylphenylether derivative in a certain ratio in order to obtain a non-aqueous organic stripper composition for negative chemically amplified resists having excellent delamination capabilities and low corrosion effects on varieties of metallic substrate plates.

In a composition of the present invention, an a) constituent used is alkylbenzenesulfonic acid represented as in the Chemical Formula 1 of which an alkyl group has a range of from 10 to 14 carbons, wherein anticorrosive effects on a metallic substrate are weak when the number of carbons is less than 10 and application is difficult due to precipitation when the number of carbons is more than 14. Detailed examples of alkyl groups include a decyl group, undecyl group, dodecyl group, tridecyl group, tetradecyl group, etc. Particularly, since straight chained soft type alkyl groups inhibit metal corrosion more than branched chained hard type alkyl groups, straight chained soft type alkyl groups should be selected to be used, and decyl group and dodecyl group are more preferable in this aspect.

Alkylbenzenesulfonic acid represented as in the Chemical Formula 1 can be obtained easily by the notified preparation method, for example by the sulfonation of alkylbenzene with sulfur trioxide, etc. Furthermore, there are no special limits in the positions of sulfonic acid groups, and any position of ortho, metha, or para is preferable with alkyl groups.

Alkylbenzenesulfonic acids of a) constituents can be used alone or with two or more acids combined, in a composition of the present invention.

Light aromatic naphtha solvent of the b) constituent is a light mineral oil obtained by petroleum distillation, and brand names such as Kokosol 100 and Kokosol 150 obtained from SK Corporation, Korea, etc. can be used in a composition of the present invention.

Organic compounds containing chlorine of the c) constituent include, for example, 1,2,3-trichlorobenzene, 1,2,4-trichlorobenzene, 1,3,5-trichlorobenzene, o-dichlorobenzene, p-chlorotoluene, etc in a composition of the present invention. These organic compounds containing chlorine can be used alone or with two or more compounds combined.

Hydroxy benzenes are preferably mixed as the d) constituent in order to improve resist delaminating properties in a composition of the present invention. Hydroxy benzenes include, for example, hydroxy benzene, o-cresol, m-cresol, p-cresol, xylenol, etc. These hydroxy benzenes are used alone or with two or more benzenes combined.

Polyoxyethylene octylphenylether derivatives of the e) constituent are compounds in which 7 to 12 moles of ethylene oxide are condensated in a composition of the present invention. HLB (Hydrophile-Lipophile Balance) values of these derivatives are determined by the addition of a number of moles of ethylene oxide, and derivatives which are within the range of from 12 to 14 carbons have superior permeabilities into metallic substrates, thus making a stripper contact with a substrate easily. HLB is a ratio of hydrophilicity and lipophilicity which is represented as a value between 0 and 20.

Resists which are targets of an organic stripper composition of the present invention, such as negative type chemically amplified resists, can be treated at a temperature range of from 70 to 90° C. for a short time of within 10 minutes while inorganic based strippers are used at a high temperature of 120° C. or more. Deposition methods in which a resist coated substrate is generally digested by a stripper solution for a certain time include a spray method in which a stripper solution is sprayed using a sprayer, a puddle method in which a certain amount of solution is dropped from rotating track equipment, etc.

Furthermore, efficiencies can be raised by applying supersonic waves during the stripping process. Resist patterns can be completely removed and a high quality substrate can be obtained by rinsing with an appropriate rinse solution or directly washing with water after removing resists with a stripper.

The present invention is described more in detail through the following EXAMPLES and COMPARATIVE EXAMPLES. However, EXAMPLES are only for exemplifying the present invention, and do not restrict the present invention.

EXAMPLES

Delamination properties and corrosion characteristics of each of the EXAMPLES and COMPARATIVE EXAMPLES were studied and evaluated through the following tests. Stripper composition ratios of EXAMPLES and COMPARATIVE EXAMPLES were mixed in weight %.

Preparation of Sample A

After coating a negative type chemically amplified resist for an I line having a wavelength of 365 nm of DiNR-100 made by Dongjin Chemical Industries Corporation to a film thickness of 1.0 μm on aluminum deposited 4 inch silicone wafers, it was heated and dried on a hot plate at a temperature of 180° C. for 90 seconds. Subsequently, after selectively irradiating active light rays through a mask, it was developed and postbaked on a hot plate at a temperature of 180° C. for 60 seconds, preparing a sample.

Main constituents of negative type chemically amplified resists for an I line having a wavelength of 365 nm comprise a polyhydroxystyrene polymer as an alkaline soluble binder resin, a melamine based compound as a cross linking agent, an acid generating agent, a dissolution inhibiting agent, and a solvent.

(Preparation of Sample B)

After coating a negative type chemically amplified resist for a KrF excimer having a wavelength of 248 nm of N-908 made by Tokyo Ohka Kogyo Co., Ltd. to a film thickness of 0.6 μm on an aluminum deposited 4 inch silicone wafer, it was heated and dried on a hot plate at a temperature of 180° C. for 90 seconds. Subsequently, after selectively irradiating active light rays through a mask, it was developed and postbaked on a hot plate at a temperature of 180° C. for 60 seconds, preparing a sample.

Main constituents of negative type chemically amplified resists for KrF having 248 nm wavelength comprise a polyhydroxystyrene copolymer as an alkaline soluble binder resin, a melamine based compound as a cross-linking agent, a light and acid generating agent, and a solvent.

(Delamination Capability and Aluminum Corrosion Evaluation)

After depositing the prepared silicone wafers into stripper compositions mixed in the compositions of Table 1 at a temperature of 85° C. for 10 minutes, they were deposited into alcohol and water respectively before drying. The delamination capability of a stripper was evaluated by examining these obtained silicone wafers with an electron microscope. The delamination capabilities of each stripper composition are represented in Table 1 as "O" for complete delamination of the resist pattern on the substrate, as "Δ" in the case of partial delamination, hence residues remained, and in the case of no removal of the resist pattern, as "X". Furthermore, the aluminum surfaces were examined with an electron microscope so as to determine whether or not corrosion occurred, and the results thereof were also noted in Table 1.

Examples 1 to 4

As a result of the resist pattern delamination treatments and aluminum surface observations of sample A and sample B of the compositions noted in Table 1, it was determined that the resist patterns on the substrates were completely delaminated, the aluminum surfaces were the same as before delamination treatment, that is, corrosion did not occur.

Comparative Examples 1 to 2

As a result of resist pattern delamination treatments and aluminum surface observations of sample A and sample B of the compositions noted in Table 1, it was determined that the resist patterns on the substrates were not completely delaminated, and corrosion permeation into the aluminum surfaces occurred during the stripping process.

TABLE 1

| Classification | Constituent a | | Constituent b | Constituent c | | Constituent d | | Constituent e | | Delamination capability Sample A | Sample B | Al corrosion |
|---|---|---|---|---|---|---|---|---|---|---|---|---|
| EX | | | | | | | | | | | | |
| 1 | DBSA | (25) | (15) | 124TCB | (44) | HB | (15) | OP-9 | (1) | O | O | No |
| 2 | DBSA | (20) | (20) | 124TCB | (39.5) | HB | (20) | OP-7 | (0.5) | O | O | No |
| 3 | DBSA | (30) | (10) | 123TCB | (34) | m-Cresol | (20) | OP-9 | (1) | O | O | No |
| 4 | DBSA | (20) | (34) | 123TCB | (30) | m-Cresol | (15) | OP-7 | (1) | O | O | No |
| COM EX. | | | | | | | | | | | | |
| 1 | *DBSA | (13) | (50) | 124TCB | (35) | HB | (2) | — | | X | X | Yes |
| 2 | *DBSA | (18) | (45) | 124TCB | (26.9) | Cathecol | (10) | OP-9 | (0.1) | Δ | Δ | Yes |

In the above Table 1,

DBSA is a straight chained dodecylbenzenesulfonic acid,

*DBSA is a branched chained dodecylbenzenesulfonic acid,

123TCB is 1,2,3-trichlorobenzene,

124TCB is 1,2,4-trichlorobenzene,

HB is hydroxy benzene,

OP-7 is a polyoxyethylene octylphenylether derivative to which 7 moles of ethylene oxide are added, and OP-9 is a polyoxyethylene octylphenylether derivative to which 9 moles of ethylene oxide are added.

A stripper composition of the present invention not only shows excellent capability in removing negative chemically amplified resists and anti-corrosion effects on varieties of metallic substrate plates such as Al, W, TiN, WSi, SiON, SiNx, HTO, etc., but it also has recycling benefits as a non-aqueous stripper even after use, and it is appropriate for use in the electronic material fields, etc. requiring high precision processing.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A stripper composition for negative chemically amplified resists comprising:

a) 20 to 35 weight % of straight chained alkylbenzenesulfonic acids represented as in the following Chemical Formula 1:

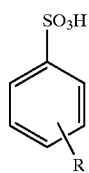

[Chemical Formula 1]

where R is an alkyl group having 10 to 14 carbons;
b) 10 to 34 weight % of light aromatic naphtha solvent;
c) 30 to 45 weight % of an organic compound containing chlorine;
d) 15 to 25 weight % of hydroxybenzenes; and
e) 0.5 to 5 weight % of polyoxyethylene octylphenylether derivatives.

2. A stripper composition for negative chemically amplified resists in accordance with claim 1, wherein alkylbenzenesulfonic acid represented as in the Chemical Formula 1 of a) is decylbenzenesulfonic acid or dodecylbenzenesulfonic acid.

3. A stripper composition for negative chemically amplified resists in accordance with claim 1, wherein the organic compounds containing chlorine of c) are one or more compounds selected from the group consisting of 1,2,3-trichlorobenzene, 1,2,4-trichlorobenzene, and 1,3,5-trichlorobenzene.

4. A stripper composition for negative chemically amplified resists in accordance with claim 1, wherein the hydroxybenzenes of d) are one or more benzenes selected from the group consisting of hydroxybenzene, o-cresol, m-cresol, p-cresol, and xylenol.

5. A stripper composition for negative chemically amplified resists in accordance with claim 1, wherein the polyoxyethylene octylphenylether derivatives of e) are one or more derivatives selected from condensates having 7 to 12 moles of ethylene oxide.

* * * * *

UNITED STATES PATENT AND TRADEMARK OFFICE
CERTIFICATE OF CORRECTION

PATENT NO. : 6,683,034 B1
DATED : January 27, 2004
INVENTOR(S) : Oh et al.

It is certified that error appears in the above-identified patent and that said Letters Patent is hereby corrected as shown below:

Column 1,
Line 7, "Property." should read -- Property --

Column 2,
Line 10, "type," should read -- type --

Signed and Sealed this

Thirteenth Day of July, 2004

JON W. DUDAS
*Acting Director of the United States Patent and Trademark Office*